United States Patent [19]

Nakamura et al.

[11] 4,002,927
[45] Jan. 11, 1977

[54] COMPLEMENTARY FET PULSE CONTROL CIRCUIT

[75] Inventors: Hideo Nakamura, Komae; Akira Iga, Tokyo, both of Japan

[73] Assignee: Sony Corporation, Tokyo, Japan

[22] Filed: May 22, 1975

[21] Appl. No.: 579,813

[30] Foreign Application Priority Data

May 27, 1974 Japan .............. 49-59452

[52] U.S. Cl. .................. 307/246; 307/251; 307/270
[51] Int. Cl.[2] ........................ H03K 17/00
[58] Field of Search .......... 307/246, 251, 270, 228, 307/283; 328/181; 357/36

[56] References Cited
UNITED STATES PATENTS

| | | | |
|---|---|---|---|
| 3,252,045 | 5/1966 | Griffin | 307/228 |
| 3,636,372 | 1/1972 | Hajita et al. | 307/246 |
| 3,716,723 | 2/1973 | Heuner et al. | 307/251 |
| 3,828,203 | 8/1974 | Belson et al. | 307/228 |
| 3,921,089 | 11/1975 | Tsurushima | 357/36 |

*Primary Examiner*—Stanley D. Miller, Jr.
*Assistant Examiner*—B. P. Davis
*Attorney, Agent, or Firm*—Hill, Gross, Simpson, Van Santen, Steadman, Chiara & Simpson

[57] ABSTRACT

A pulse control circuit comprising a first FET (Field Effect Transistor), put into the conductive state in response to an input pulse signal, a first time constant circuit charged when the first FET is put in the conductive state, a second FET put into the conductive state with the charging voltage of the first time constant circuit, and a second time constant circuit discharging the charged electricity in the first time constant circuit when the second FET is put in the conductive state.

12 Claims, 7 Drawing Figures

COMPLEMENTARY FET PULSE CONTROL CIRCUIT

BACKGROUND OF THE INVENTION

1. Field of the Invention

This invention relates to a pulse control circuit, and more particularly is directed to a pulse control circuit provided with an arrangement by which a pulse wave form can be changed.

2. Description of the Prior Art

Heretofore, it has been necessary to separately provide signal forming circuits in accordance with wave forms to be obtained, such as a saw tooth wave and a triangular wave. For example, a circuit is proposed in which a pulse signal is supplied to a base of a bipolar transistor and an output signal is obtained through a time constant circuit consisting of a resistor and a capacitor, connected to a collector or an emitter of a transistor. In such a circuit, it is possible to vary the wave form of the output signal with the resistance of the resistor and/or the capacitance of the capacitor. As generally known, however, the output signal is already distorted at the output terminal of the transistor due to the hole storage time of the transistor and the carrier storage time thereof. The distortion cannot be rectified with the adjustment of the resistor and the capacitor.

SUMMARY OF THE INVENTION

An object of this invention is to provide a pulse control circuit comprising a first FET (Field Effect Transistor), put into the conductive state in response to an input pulse signal, a first time constant circuit charged when the first FET is put in the conductive state, a second FET put into the conductive state with the charging voltage of the first time constant circuit, and a second time constant circuit discharging the charged electricity in the first time constant circuit when the second FET is put in the conductive state.

Another object of this invention is to provide a novel pulse control circuit in which there is no possiblity that a signal wave form will be distorted due to the carrier storage time and the hole storage time.

A further object of this invention is to provide a novel pulse control circuit by which an input pulse signal can be easily and accurately transformed into a saw tooth wave form, a triangular wave form or a different wave form in synchronization with the leading and trailing of the input pulse signal.

A still further object of this invention is to provide a novel pulse control circuit in which the DC level does not change.

The above and other objects, features and advantages of this invention will become apparent from the following detailed description of illustrative embodiments shown in the accompanying drawings.

DESCRIPTION OF THE PREFERRED EMBODIMENTS

Figure 1:
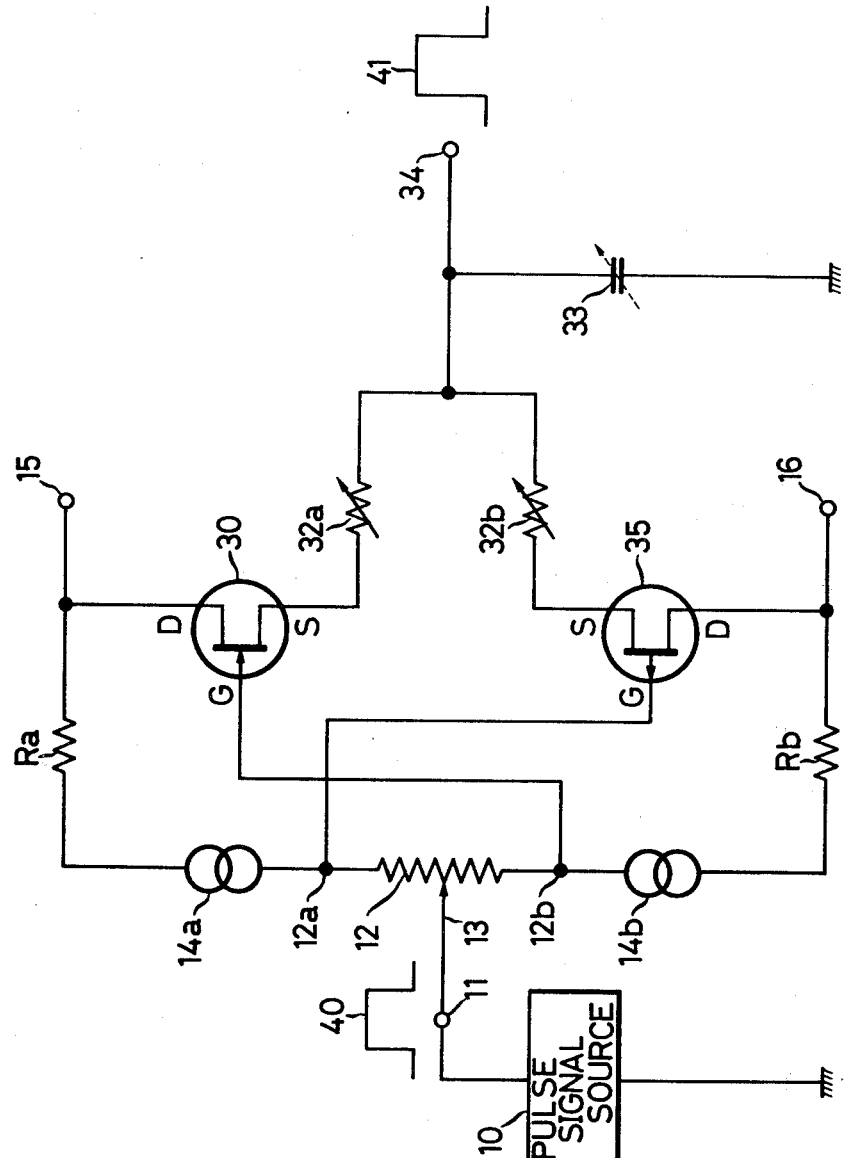
FIG. 1 is a schematic diagram showing one embodiment of a pulse control circuit in accordance with this invention.

FIG. 1 is a circuit diagram of one embodiment of a pulse control circuit in accordance with this invention. In FIG. 1, a pulse signal source 10 is connected through a terminal 11 to a movable contact 13 of a potentiometer 12. One end 12a of the potentiometer 12 is connected through a first constant current circuit 14a and a resistor Ra to a first DC power source 15. Another end 12b of the potentiometer 12 is connected through a second constant current circuit 14b and a resistor Rb to a second DC power source 16 having a reverse polarity to the first DC power source 15. As below mentioned, first and second vertical type junction FETs and time constant circuits are connected between the first and second DC power sources 15 and 16. The first and second constant current circuits 14a and 14b, the resistors Ra and Rb and the potentiometer 12 constitute a biasing circuit for the FETs.

Figure 2:
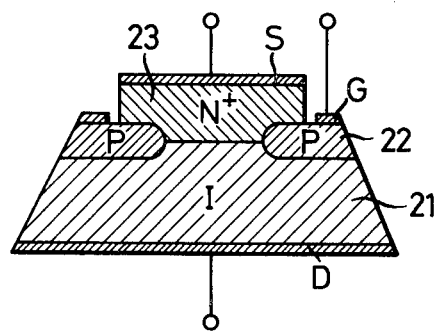
FIG. 2 is a sectional view showing one example of an FET having triode-type dynamic characteristics which is used in the pulse control circuit of this invention.

Turning now to FIG. 2, there is depicted a sectional view of one example of an FET having triode-type dynamic characteristics which may be used in the pulse control circuit in accordance with this invention. The FET is a vertical junction structure formed of an intrinsic semiconductor region 21 having low impurity concentration and high resistance, a first-type (P-type) semiconductor region 22 having an annular configuration and formed on the upper portion of the intrinsic region 21, and a second-type (N-type) semiconductor region 23 having high impurity concentration formed over both the annular first-type (P-type) region 22 and the intrinsic region 21, as shown. Respective drain (D), gate (G) and source (S) electrodes are provided at the lower surface of the intrinsic region 21, an exposed portion of the first-type (P-type) annular region 22 and the upper surface of the second-type (N-type) region 23, respectively.

Figure 3:
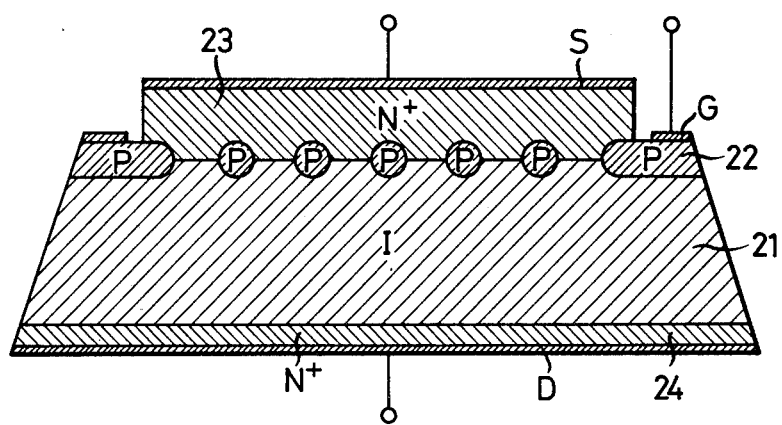
FIG. 3 is a sectional view showing another example of an FET having triode-type dynamic characteristics which is used in the pulse control circuit of this invention.

The vertical junction FET depicted in FIG. 2 exhibits triode-type dynamic characteristics. A preferred embodiment of such an FET is depicted in FIG. 3, wherein like reference numerals identify corresponding elements. As is apparent, the FIG. 3 embodiment closely resembles the aforedescribed FIG. 2 embodiment of the FET with the added modifications that the first-type (P-type) annular region 22 is formed with a mesh-type structure therewithin, as shown. Accordingly, the high impurity concentration second-type (N-type) region 22 is seen to overlie both the annular and mesh-shape first-type (P-type) region 22 and the intrinsic region 21, the mesh-shape defining a boundary between the intrinsic region and the overlying high impurity concentration second-type (N-type) region. Furthermore, an additional second-type (N-type) semiconductor region 24 having high impurity concentration is formed on the lower surface of the intrinsic semiconductor region 21, and the drain electrode D is formed thereon.

In general, the apparent conversion conductance $gm$ of a junction FET may be expressed as:

$$gm = \frac{Gm}{1 + Rc \cdot Gm}$$

where $Gm$ is the true conversion conductance and $Rc$ is an equivalent internal resistance of the FET between the source and drain electrodes. The resistance $Rc$ is a composite resistance comprised of the resistance between the source electrode and the channel within the FET, the resistance of the channel itself and the resistance between the channel and the drain electrode.

In comparison to prior art junction FETs, the FET shown in FIG. 3 is characterized by a relatively small separation between the source electrode S and a channel formed in the P-type region 22 and, additionally, the channel length itself is relatively small. Consequently, the resistance $Rc$ of the vertical junction FET depicted in FIG. 3 is much smaller than the resistance $Rc$ of the prior art FETs and the true conversion conductance $Gm$ is high. The product $RcGm$ generally is less than unity. Thus, as is recognized from the above equation, the apparent conversion conductance $gm$ of the vertical junction FET, shown by way of example in FIG. 3, which is used with the present invention, closely approximates the true conversion conductance $Gm$ depending upon the width variation of the depletion layer.

It will be understood that when the semiconductivities of the first type semiconductor region 22 and the second type semiconductor region 23 are interchanged in FIG. 3, an FET having a different polarity can be obtained.

Moreover, currents flow vertically through the potential between the source and drain in the above-mentioned FET due to its construction. The FET is not a current-control element using minority carriers such as a bipolar transistor, but they are a voltage-control element using majority carriers. Accordingly, they have no charge storage effect, have an extremely short switching time and little storage time. As the result, notching distortion is suppressed in high frequencies and high harmonic distortion is small.

Figure 4:
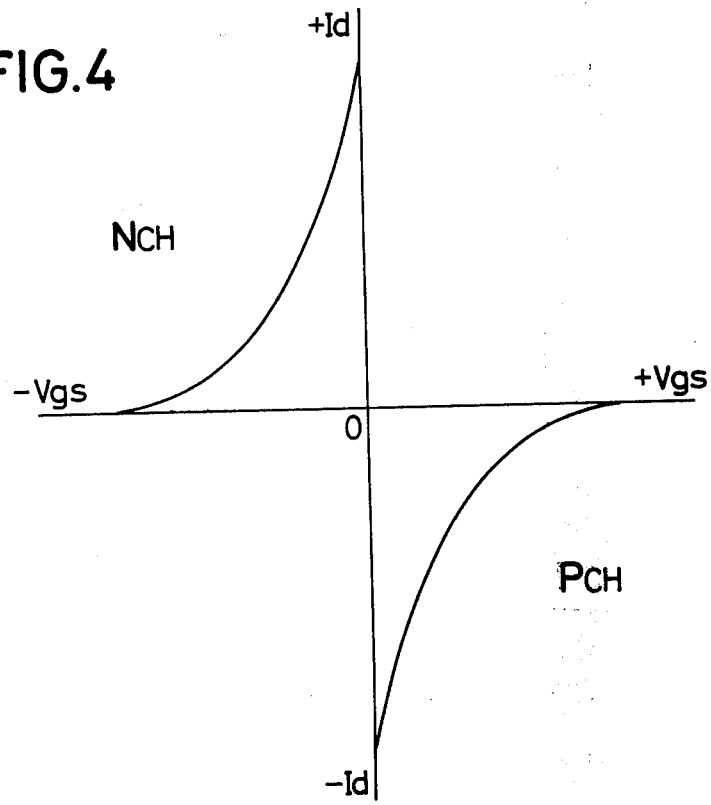
FIG. 4 is a graph showing $V_{GS}$-Id characteristics of an N-channel type V-FET and a P-channel type V-FET.

FIG. 4 shows one of the characteristics of the above-mentioned FET. In FIG. 4, abscissas is for gate-source voltage $V_{GS}$ and ordinates is for drain current $I_d$. As apparent from FIG. 4, the characteristic corresponds to that of the $E_g$–$I_p$ characteristic of a triode vacuum tube. The characteristic is different from the characteristic of a conventional transistor. Since the above-mentioned FETs have no carrier storage effect, high speed switching operation is possible and pulse signals having short rise-time and fall-time can be produced.

The FET is classified into an N-channel type and a P-channel type in accordance with the polarities of the gate voltage $V_{GS}$ and the drain current $I_d$.

Turning again to FIG. 1, a gate G of an N-channel type FET 30 as above mentioned is connected to the fixed terminal 12b of the potentiometer 12, whereby a gate voltage is supplied to the gate G of the N-channel type FET 30 by the second constant current circuit 14b and the resistor Rb. The drain D of the N-channel type FET 30 is connected to the positive DC voltage source 15. The source S of the N-channel type FET 30 is connected to a first time constant circuit constituted by a variable resistor 32a and a capacitor 33 and also to an output terminal 34. The gate G of a P-channel type FET 35 is connected to the fixed terminal 12a of the potentiometer 12, whereby a gate voltage is supplied to the gate G of the P-channel type FET 35. The drain D of the P-channel type FET 35 is connected to the negative DC power source 16. The source S of the P-channel type FET 35 is connected to a second time constant circuit constituted by a variable resistor 32b and the capacitor 33, and also to the output terminal 34.

Next, operations of the pulse control circuit of FIG. 1, will be described.

The current flowing through the potentiometer 12 is maintained constant by the constant current circuits 14a and 14b. When no input pulse signal is applied to the terminal 11, the gate voltages of the FETs 30 and 35 are adjusted with the movable contact 13 of the potentiometer 12 so that the output terminal 34 is at zero potential.

When a positive pulse signal 40, as shown on FIG. 1, is supplied to the movable contact 13 of the potentiometer 12 through the terminal 11 from the pulse signal source 10, it is applied to the gates G of the FETs 30 and 35, added to the bias voltages, so that the N-channel type FET 30 is put into the ON-state. The amplified pulse signal is supplied to the first time constant circuit constituted by the variable resistor 32a and the capacitor 33 from the source S of the N-channel type FET 30, so that the capacitor 33 is charged.

When the resistance of the variable resistor 32a and the capacitance of the capacitor 33 are extremely low, a leading portion of the output signal 41 is not distorted at the output terminal 34, corresponding to a leading portion of the input signal 40. The capacitor 33 charged at a certain voltage is not discharged until the level of the input pulse signal 40 falls.

On fall of the level of the input pulse signal 40, the one FET 30 is put into the OFF-state, while the other FET 35 is put into the ON-state since the charging voltage of the capacitor 33 is applied to the source S of the FET 35 through the variable resistor 32b. Accordingly, the electrically charged capacitor 33 is discharged to the negative power source 16 through the variable resistor 32b and the FET 35. When the resistance of the variable resistor 32b and therefore the discharging time constant are extremely low, a trailing portion of the output signal 41 is not distorted at the output terminal 34, corresponding to a trailing portion of the input signal 40.

Figure 5A:
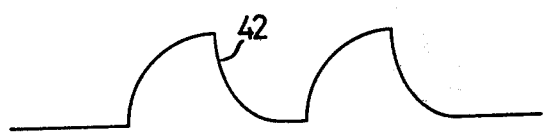
FIG. 5A, FIG. 5B and FIG. 5C are charts wave forms obtained by the pulse control circuit of this invention, respectively.
Figure 5B:
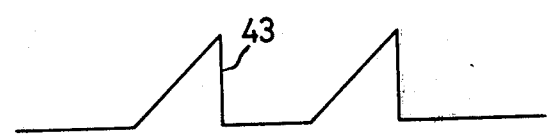
Figure 5C:
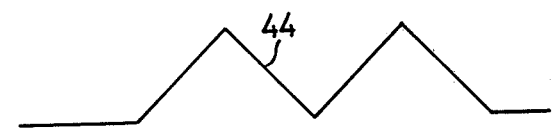

The input pulse signal 40 can be transformed into a saw tooth wave form, a triangular wave form or any other wave form in accordance with the resistances of the variable resistors 32a and 32b. For example, when the resistance of the variable resistor 32a is higher and the resistance of the variable resistor 32b is lower, the capacitor 33 is gradually charged for the leading of the pulse signal 40 and it is nearly linearly discharged for the trailing of the pulse signal 40. Accordingly, the input pulse signal 40 is transformed into a wave form 42 shown on FIG. 5A. When the resistance of the variable resistor 32a is further higher and the resistance of the variable resistor 32b is further lower, a wave form 43 shown on FIG. 5B is obtained at the output terminal 34. And when both the resistance of the variable resistor 32a and the resistance of the variable resistor 32b are further higher, a wave form 44 shown on FIG. 5C is obtained at the output terminal 34. Besides, different wave forms can be obtained by changing the resistances of the variable resistors 32a and 32b for charging and discharging respectively.

It will be understood that the input pulse signal can be not only transmitted with high fidelity, but also it can be transformed into a different wave form such as a saw tooth wave form or a triangular wave form by adjusting the time constants without changing connections, in the arrangement comprising a first FET put into the conductive state in response to an input pulse signal, a first time constant circuit consisting of a variable resistor and a capacitor, charged when the first FET is put in the conductive state, a second FET put into the conductive state with the charging voltage of the first time constant circuit and a second time constant circuit consisting of a variable resistor and the capacitor, discharging the charged electricity in the first time constant circuit when the second FET is put in the conductive state. The capacitor 33 may be variable, as occasion demands.

While there have been described preferred embodiments of the invention, obviously modifications and variations are possible in light of the above teachings. It is, therefore, to be understood that within the scope of the appended claims, the invention may be practiced otherwise than as specifically described.

We claim as our invention:

1. A pulse control circuit comprising:
    an input terminal supplied with a pulse signal;
    a first FET put into the conductive state in response to said pulse signal;
    a first time constant circuit charged when said first FET is put in the conductive state;
    a second FET put into the conductive state with the charging voltage of said first time constant circuit;
    a second time constant circuit discharging the charged electricity in said first time constant circuit when said second FET is put in the conductive state;
    an output terminal to deliver an output signal having a wave form in accordance with the time constants of said first and second time constant circuits including first and second DC power sources of different polarity, said first and second FETs connected in series with said first and second DC power sources and said first and second time constant circuits being connected between said first and second FETs, wherein said first and second FETs have drains, sources and gates, said sources being connected to said first and second time constant circuits respectively, and said gates being connected to a biasing circuit including a constant current circuit connected between said first and second DC power sources and a resistor connected in series with said constant current circuit.

2. A pulse control circuit accordng to claim 1, wherein one end of said resistor connected to said constant current circuit is connected to the gate of said first FET and another end of said resistor is connected to the gate of said second FET, said resistor having a movable contact connected to said input terminal.

3. A pulse control circuit according to claim 1, wherein said first and second FETs are of the junction-type exhibiting triode-type dynamic characteristics, having polarities opposite to each other, respectively.

4. A pulse control circuit comprising:
    an input terminal supplied with a pulse signal;
    a first FET put into the conductive state in response to said pulse signal;
    a first time constant circuit charged when said first FET is put in the conductive state;
    a second FET put into the conductive state with the charging voltage of said first time constant circuit;
    a second time constant circuit discharging the charged electricity in said first time constant circuit when said second FET is put in the conductive state;
    an output terminal to deliver an output signal having a wave form in accordance with the time constants of said first and second time constant circuits, wherein said first and second FETs have polarities opposite to each other, drains, sources and gates, first and second DC power sources, the drain of said first FET is connected to said first DC power source, the drain of said second FET is connected to said second DC power source which has a polarity opposite to that of said first DC power source, and the sources of said first and second FETs connected to said first and second time constant circuits, respectively, and a constant current circuit connected to the gates of said first and second FETs.

5. A pulse control circuit according to claim 4, wherein said first time constant circuit comprises a first resistor and a capacitor, and said second time constant circuit comprises a second resistor and said capacitor.

6. A pulse control circuit according to claim 5, wherein at least one of said first and second resistors of said time constant circuits is a variable resistor.

7. A pulse control circuit according to claim 5, wherein said capacitor is a variable capacitor.

8. A pulse control circuit comprising:
    an input terminal supplied with a pulse signal;
    a first FET put into the conductive state in response to said pulse signal;
    a first time constant circuit charged when said first FET is put in the conductive state;
    a second FET put into the conductive state with the charging voltage of said first time constant circuit;
    a second time constant circuit discharging the charged electricity in said first time constant circuit when said second FET is put in the conductive state;
    an output terminal to deliver an output signal havng a wave form in accordance with the time constants of said first and second time constant circuits, wherein said first and second FETs have drains, sources and gates, said sources being connected to said first and second time constant circuits respectively, and said gates being connected to a biasing circuit including a constant current circuit connected between said first and second DC power sources and a resistor connected in series with said constant current circuit, wherein said first FET is a vertical junction structure formed of an intrinsic semiconductor region having low impurity concentration and high resistance, a first type semiconductor region having a predetermined configuration and formed on the upper portion of said intrinsic semiconductor region, and a second type semiconductor region having high impurity concentration formed over both said first type semiconductor region and said intrinsic semiconductor region, said second FET being a vertical junction structure formed of an intrinsic semiconductor region having low impurity concentration and high resistance, a second type semiconductor region having a predetermined configuration and formed on the upper portion of the said intrinsic semiconductor region, and a first type semiconductor region having high impurity concentration formed over both said second type semiconductor region and said intrinsic semiconductor region.

9. A pulse control circuit comprising:

a first FET of a first polarity, a second FET of a second polarity, a first voltage source of a first polarity, a second voltage source of a second polarity, said first and second FETs being connected in series between said first and second voltage sources;

a biasing circuit for applying biasing voltages to the gates of said first and second FETs, a pulse signal source supplying a pulse signal to said FETs, a first time constant circuit connected to said first FET and consisting of a first resistor and a capacitor; and a second time constant circuit connected to said second FET and consisting of a second resistor and said capacitor; said capacitor being charged through said first resistor when said first FET is in the conductive state in response to said pulse signal, and charged voltage in said capacitor being discharged through said second resistor when said second FET is in the conductive state in response to said charged voltage, said biasing circuit including first and second DC voltage sources, a constant current circuit connected between said voltage sources, and a third resistor connected in series with said constant current circuit.

10. A pulse control circuit according to claim 9, wherein at least one of said first and second resistors is a variable resistor.

11. A pulse control circuit according to claim 9, wherein said capacitor is a variable capacitor.

12. A pulse control circuit according to claim 9, wherein each of said first and second FETs is a vertical junction structure having triode-type dynamic characteristics.

* * * * *